(12) United States Patent
Morikita et al.

(10) Patent No.: US 10,770,268 B2
(45) Date of Patent: Sep. 8, 2020

(54) PLASMA PROCESSING METHOD AND PLASMA PROCESSING APPARATUS

(71) Applicant: TOKYO ELECTRON LIMITED, Tokyo (JP)

(72) Inventors: Shinya Morikita, Miyagi (JP); Takanori Banse, Miyagi (JP); Takahisa Iwasaki, Miyagi (JP); Ryosuke Niitsuma, Hillsboro, OR (US); Hiroki Taoka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 34 days.

(21) Appl. No.: 15/865,841

(22) Filed: Jan. 9, 2018

(65) Prior Publication Data

US 2018/0197720 A1   Jul. 12, 2018

(30) Foreign Application Priority Data

Jan. 12, 2017   (JP) .................................. 2017-003024

(51) Int. Cl.
*H01J 37/32* (2006.01)
*C23C 16/44* (2006.01)
(Continued)

(52) U.S. Cl.
CPC .......... *H01J 37/32477* (2013.01); *B08B 7/00* (2013.01); *C23C 16/26* (2013.01); *C23C 16/401* (2013.01); *C23C 16/4404* (2013.01); *C23C 16/4405* (2013.01); *C23C 16/4557* (2013.01); *C23C 16/45565* (2013.01); *C23C 16/505* (2013.01); *H01J 37/32009* (2013.01); *H01J 37/32091* (2013.01); *H01J 37/32165* (2013.01); *H01J 37/32449* (2013.01); *H01L 21/67069* (2013.01)

(58) Field of Classification Search
CPC combination set(s) only.
See application file for complete search history.

(56) References Cited

U.S. PATENT DOCUMENTS

2006/0021702 A1* 2/2006 Kumar .............. H01L 21/02071
156/345.32
2008/0118663 A1* 5/2008 Choi .................... C23C 16/4404
427/579
2017/0076956 A1 3/2017 Hirayama et al.

FOREIGN PATENT DOCUMENTS

JP 2016-012712 A 1/2016
WO WO2015/1865525 * 12/2015 ......... H01L 21/3065

* cited by examiner

*Primary Examiner* — Erin F Bergner
(74) *Attorney, Agent, or Firm* — Rothwell, Figg, Ernst & Manbeck, P.C.

(57) ABSTRACT

In a plasma processing method, a carbon-containing film is formed on surfaces of components in a chamber by using a plasma of a carbon-containing gas, and a silicon-containing film whose film thickness is determined based on a film thickness of the carbon-containing film is formed on a surface of the carbon-containing film by a silicon-containing gas. Then, a target object is loaded into the chamber and processed by a plasma of a processing gas after the formation of the silicon-containing film. The silicon-containing film is removed from the surface of the carbon-containing film by using a plasma of a fluorine-containing gas after the target object processed by the plasma is unloaded from the chamber, and the carbon-containing film is removed from the surfaces of the components by using a plasma of an oxygen-containing gas.

10 Claims, 7 Drawing Sheets

(51) Int. Cl.
*B08B 7/00* (2006.01)
*C23C 16/455* (2006.01)
*C23C 16/26* (2006.01)
*C23C 16/505* (2006.01)
*C23C 16/40* (2006.01)
H01L 21/67 (2006.01)

FIG.3

| | W/O Carbon Coating | 1st layer; Carbon Coating | | |
|---|---|---|---|---|
| | 0nm | 50nm | 100nm | 200nm |
| W/O Ox Coating — 0nm | Ave. 1.3 | Ave. 22.7 | Ave. 130.7 | Ave. 124.0 |
| 2nd layer; Ox Coating — 20nm | | | Ave. 2.0 | |
| 2nd layer; Ox Coating — 50nm | Ave. 8.7 | | Ave. 5.0 | Ave. 34.7 |
| 2nd layer; Ox Coating — 100nm | Ave. 3.7 | | Ave. 3.3 | Ave. 8.7 |
| 2nd layer; Ox Coating — 200nm | Ave. 1.3 | | Ave. 1.0 | |

FIG.5

| NF$_3$ /O$_2$ | Sel. | |
|---|---|---|
| | Ox/Carbon | Ox/Poly |
| UEL (Center) | 1.33 | 2.89 |
| UEL (Middle) | 1.15 | 2.74 |
| UEL (Edge) | 0.99 | 2.94 |

FIG.6

| CF$_4$ | Sel. | |
|---|---|---|
| | Ox/Carbon | Ox/Poly |
| UEL (Center) | 3.18 | 1.65 |
| UEL (Middle) | 3.29 | 1.67 |
| UEL (Edge) | 3.22 | 1.33 |

PLASMA PROCESSING METHOD AND PLASMA PROCESSING APPARATUS

CROSS-REFERENCE TO RELATED APPLICATIONS

This application claims priority to Japanese Patent Application No. 2017-003024 filed on Jan. 12, 2017, the entire contents of which are incorporated herein by reference.

FIELD OF THE INVENTION

The disclosure relates to a plasma processing method and a plasma processing apparatus.

BACKGROUND OF THE INVENTION

In a semiconductor manufacturing process, a plasma processing apparatus for performing plasma processing such as deposition of thin film, etching or the like is widely used. The plasma processing apparatus may be, e.g., a plasma CVD (Chemical Vapor Deposition) apparatus for depositing a thin film, a plasma etching apparatus for performing etching, or the like.

In the plasma processing apparatus, components provided in the chamber (hereinafter, simply referred to as "in-chamber components") are exposed to a plasma of a processing gas during various plasma processes and thus require a plasma resistance. Therefore, there is known a technique for forming a protective film for protecting the in-chamber components on surfaces of the in-chamber components. For example, Japanese Patent Application Publication No. 2016-12712 discloses a technique for protecting in-chamber components by a protective film including a carbon-containing film formed on surfaces of the in-chamber components and a silicon-containing film formed on a surface of the carbon-containing film.

However, in a conventional technique for protecting the in-chamber components by the protective film including the carbon-containing film and the silicon-containing film, when a film thickness of the silicon-containing film is not appropriate for a film thickness of the carbon-containing film, especially when the silicon-containing film is thin, the adhesivity of the silicon-containing film to the carbon-containing film is insufficient. Therefore, when the protective film is exposed to a plasma of a processing gas, reaction products are released as particles into the chamber. As a result, in the conventional technique, a large amount of particles may be generated from the protective film for protecting the in-chamber components.

SUMMARY OF THE INVENTION

In accordance with an aspect, there is provided a plasma processing method including: a first film forming step of forming a carbon-containing film on surfaces of components in a chamber by using a plasma of a carbon-containing gas; a second film forming step of forming a silicon-containing film whose film thickness is determined based on a film thickness of the carbon-containing film on a surface of the carbon-containing film by a silicon-containing gas; a plasma processing step of processing a target object loaded into the chamber by using a plasma of a processing gas after the formation of the silicon-containing film; a first removal step of removing the silicon-containing film from the surface of the carbon-containing film by using a plasma of a fluorine-containing gas after the target object processed by the plasma is unloaded from the chamber; and a second removal step of removing the carbon-containing film from the surfaces of the components by using a plasma of an oxygen-containing gas.

In accordance with an aspect, there is provided a plasma processing apparatus including: a chamber in which a target object is processed by a plasma; a gas exhaust unit configured to decrease a pressure in the chamber; a gas supply unit configured to supply a processing gas into the chamber; and a control unit configured to perform a film forming step of forming a carbon-containing film on surfaces of components in the chamber by using a plasma of a carbon-containing gas, a second film forming step of forming a silicon-containing film whose film thickness is determined based on a film thickness of the carbon-containing film on a surface of the carbon-containing film by a silicon-containing gas, a plasma processing step of processing the target object loaded into the chamber by using a plasma of the processing gas after the formation of the silicon-containing film, a first removal step of removing the silicon-containing film from the surface of the carbon-containing film by using a plasma of a fluorine-containing gas after unloading of the target object processed by the plasma from the chamber, and a second removal step of removing the carbon-containing film from the surfaces of the components by using a plasma of an oxygen-containing gas.

BRIEF DESCRIPTION OF THE DRAWINGS

The objects and features of the disclosure will become apparent from the following description of embodiments, given in conjunction with the accompanying drawings, in which:

FIG. 3 shows exemplary relation between a film thickness of a carbon-containing film, a film thickness of a silicon-containing film and the number of particles generated from a protective film including the carbon-containing film and the silicon-containing film;

FIG. 5 shows exemplary relation between a fluorine-containing gas used for removing the silicon-containing film and a selectivity of the silicon-containing film;

FIG. 6 shows exemplary relation between a fluorine-containing gas used for removing the silicon-containing film and a selectivity of the silicon-containing film;

DETAILED DESCRIPTION OF THE EMBODIMENTS

Figure 1:
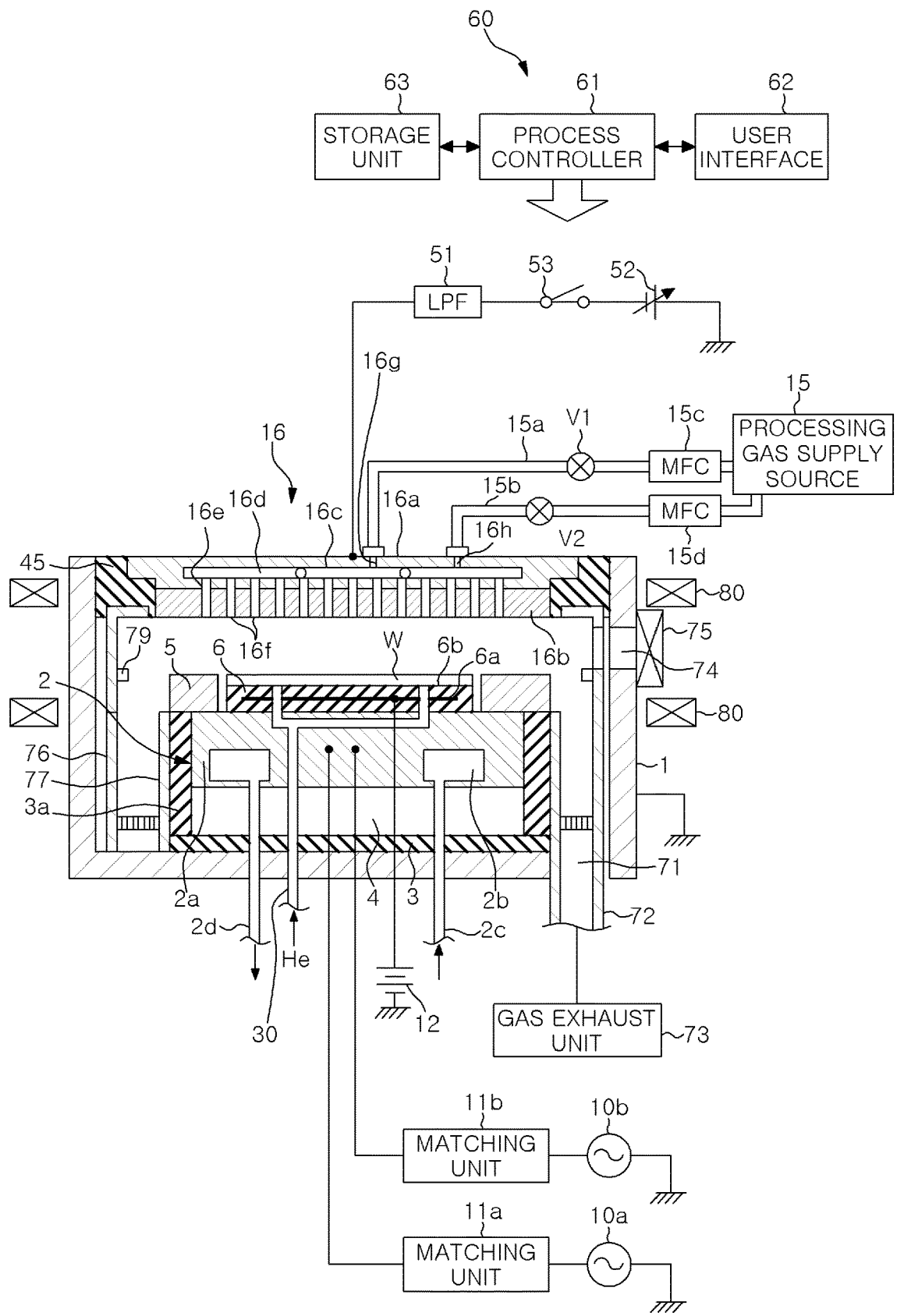
FIG. 1 is a schematic cross sectional view showing a plasma processing apparatus applied to a plasma processing method according to an embodiment.

Hereinafter, embodiments of a plasma processing method and a plasma processing apparatus of the present disclosure will be described in detail with reference to the accompanying drawings. Like reference numerals will be used for like or corresponding parts throughout the drawings.

FIG. 1 is a schematic cross sectional view showing a plasma processing apparatus applied to a plasma processing method according to an embodiment. The plasma processing apparatus shown in FIG. 1 includes an airtight processing chamber 1 that is electrically grounded. The processing chamber 1 is formed in a cylindrical shape and made of, e.g., aluminum having an anodically oxidized surface. A mounting table 2 for horizontally supporting a semiconductor wafer W as a target object is provided in the processing chamber 1.

The mounting table 2 has a base 2a made of a conductive metal, e.g., aluminum or the like. The mounting table 2 serves as a lower electrode. Further, the mounting table 2 is supported by a conductive supporting table 4 through an insulating plate 3. A focus ring 5 made of, e.g., single crystalline silicon, is provided on an outer periphery of the mounting table 2. A cylindrical inner wall member 3a made of, e.g., quartz or the like, is provided to surround an edge of the mounting table 2 and an edge of the supporting table 4.

A shower head 16 serving as an upper electrode is provided above the mounting table 2 to face the mounting table 2 in parallel therewith. In other words, the shower head 16 is provided to face the semiconductor wafer W supported on the mounting table 2. The shower head 16 and the mounting table 2 function as a pair of electrodes (upper electrode and lower electrode). A first high frequency power supply 10a is connected to the base 2a of the mounting table 2 via a first matching unit 11a. A second high frequency power supply 10b is connected to the base 2a of the mounting table 2 via a second matching unit 11b. The first high frequency power supply 10a is used for plasma generation and supplies a high frequency power having a predetermined frequency (e.g., 100 MHz) to the base 2a of the mounting table 2. The second high frequency power supply 10b is used for ion attraction (bias) and supplies a high frequency power having a predetermined frequency (e.g., 13 MHz) lower than that from the first high frequency power supply 10a to the base 2a of the mounting table 2.

An electrostatic chuck 6 for attracting and holding the semiconductor wafer W is mounted on a top surface of the mounting table 2. The electrostatic chuck 6 has a structure in which an electrode 6a is embedded in an insulator 6b. The electrode 6a is connected to a DC power supply 12. The semiconductor wafer W is attracted and held on the electrostatic chuck 6 by a Coulomb force generated by applying a DC voltage from the DC power supply 12 to the electrode 6a.

A coolant path 2b is formed in the mounting table 2. The coolant path 2b is connected to a coolant inlet line 2c and a coolant outlet line 2d. By circulating a coolant such as Galden or the like through the coolant path 2b, the supporting table 4 and the mounting table 2 can be controlled to predetermined temperatures. A backside gas supply line 30 for supplying a cold heat transfer gas (backside gas) such as He gas or the like to a backside of the semiconductor wafer W penetrates through the mounting table 2 and the like. The backside gas supply line 30 is connected to a backside gas supply source (not shown). With this configuration, the semiconductor wafer W attracted and held on the electrostatic chuck 6 on the top surface of the mounting table 2 can be controlled to a predetermined temperature.

The shower head 16 is provided at a ceiling wall portion of the processing chamber 1. The shower head 16 includes a main body 16a and an upper ceiling plate 16b serving as an electrode plate. The shower head 16 is supported at an upper portion of the processing chamber 1 through an insulating member 45. The main body 16a is made of a conductive material, e.g., aluminum having an anodically oxidized surface. The upper ceiling plate 16b is detachably held at a bottom portion of the main body 16a. The upper ceiling plate 16b is made of a silicon-containing material, e.g., quartz.

Gas diffusion spaces 16c and 16d are formed in the main body 16a. A plurality of gas through holes 16e is formed in the bottom portion of the main body 16a to be positioned below the gas diffusion spaces 16c and 16d. The gas diffusion space is divided into the gas diffusion space 16c provided at a central portion and the gas diffusion space 16d provided at a peripheral portion. Therefore, the supply state of the processing gas can be controlled separately at the central portion and the peripheral portion.

Gas injection holes 16f are formed through the upper ceiling plate 16b in a thickness direction thereof. The gas injection holes 16f communicate with the gas through holes 16e. With this configuration, the processing gas supplied to the gas diffusion spaces 16c and 16d is supplied in a shower form into the processing chamber 1 through the gas through holes 16e and the gas injection holes 16f. A temperature controller such as a heater (not shown), a pipe (not shown) for circulating a coolant, and the like are provided at the main body 16a. Accordingly, the shower head 16 can be controlled to a desired temperature during a plasma etching process.

Two gas inlet ports 16g and 16h for introducing the processing gas into the gas diffusion spaces 16c and 16d, respectively, are formed in the main body 16a. One ends of gas supply lines 15a and 15b are respectively connected to the gas inlet ports 16g and 16h and the other ends of the gas supply lines 15a and 15b are connected to a processing gas supply source 15 for supplying an etching gas. The processing gas supply source 15 is an example of a gas supply unit. A mass flow controller (MFC) 15c and an opening/closing valve V1 are disposed in the gas supply line 15a in that order from an upstream side. A mass flow controller (MFC) 15d and an opening/closing valve V2 are disposed in the gas supply line 15b in that order from the upstream side.

The processing gas for plasma etching is supplied from the processing gas supply source 15 to the gas diffusion spaces 16c and 16d through the gas supply line 15a and 15b, respectively. Then, the processing gas is supplied in a shower form into the processing chamber 1 through the gas through holes 16e and the gas injection holes 16f. For example, as will be described later, a carbon-containing gas used for forming a carbon-containing film on components in the processing chamber 1 is supplied from the processing gas supply source 15. For example, a silicon-containing gas used for forming a silicon-containing film on a surface of the carbon-containing film is supplied from the processing gas supply source 15. For example, a processing gas containing $CF_4$ used for performing plasma processing on a target object is supplied from the processing gas supply source 15. For example, a fluorine-containing gas used for removing the silicon-containing film from the surface of the carbon-containing film is supplied from the processing gas supply source 15. An oxygen-containing gas used for removing the carbon-containing film from the surface of the components in the processing chamber 1 is supplied from the processing gas supply source 15. The gases supplied from the processing gas supply source 15 will be described in detail later.

A variable DC power supply 52 is electrically connected to the shower head 16 serving as the upper electrode via a low pass filter (LPF) 51. A power supply of the variable DC power supply 52 is on-off controlled by an on/off switch 53. Current/voltage of the variable DC power supply 52 and on/off of the on/off switch 53 are controlled by a control unit 60 to be described later. As will be described later, when a plasma is generated in the processing space by applying the high frequency power from the first and the second high frequency power supply 10a and 10b to the mounting table 2, the on/off switch 53 is turned on by the control unit 60 and a predetermined DC voltage is applied to the shower head 16 serving as the upper electrode, if necessary.

A gas exhaust port 71 is formed in a bottom portion of the processing chamber 1. A gas exhaust unit 73 is connected to the gas exhaust port 71 through a gas exhaust line 72. The gas exhaust unit 73 has a vacuum pump. By operating the vacuum pump, a pressure in the processing chamber 1 can be decreased to a predetermined vacuum level. The gas exhaust unit 73 is an example of the gas exhaust unit. A loading/unloading port 74 for the semiconductor wafer W and a gate valve 75 for opening/closing the loading/unloading port 74 are provided at the sidewall of the processing chamber 1.

Deposition shields 76 and 77 are detachably provided along an inner wall of the processing chamber 1. The deposition shields 76 and 77 have a function of preventing etching products (deposits) from being attached to the inner wall of the processing chamber 1. Hereinafter, the inner wall of the processing chamber 1 and the deposition shield 76 may be collectively referred to as "inner wall of the processing chamber 1". The deposition shield 77 covers the mounting table 2 serving as the lower electrode, the inner wall member 3a and the outer peripheral surface of the supporting table 4. Hereinafter, the mounting table 2, the inner wall member 3a, the supporting table 4 and the deposition shield 77 may be collectively referred to as "lower electrode". A conductive member (GND block) 79 is provided at a portion of the deposition shield 76 at substantially the same height as the height of the semiconductor wafer W. Due to the presence of the conductive member 79, abnormal discharge is prevented.

Ring magnets 80 are concentrically provided around the processing chamber 1. The ring magnets 80 generate a magnetic field in a space between the shower head 16 and the mounting table 2. The ring magnets 80 can be rotated by a rotation unit (not shown).

The operation of the plasma processing apparatus configured as described above is integrally controlled by the control unit 60. The control unit 60 includes a process controller 61 having a CPU and configured to control respective components of the plasma etching apparatus, a user interface 62, and a storage unit 63.

The user interface 62 includes a keyboard through which a process manager inputs a command to operate the plasma etching apparatus, a display for visualizing and displaying an operation state of the plasma etching apparatus, and the like.

The storage unit 63 stores therein recipes including control programs (software) for executing various processes performed in the plasma etching apparatus under the control of the process controller 61, processing condition data and the like. In response to an instruction from the user interface 62 or the like, a certain recipe is retrieved from the storage unit 63 and executed by the process controller 61. Accordingly, a desired process is performed in the plasma etching apparatus under the control of the process controller 61. The recipes including the control programs and the processing condition data can be read out from a computer-readable storage medium (e.g., a hard disk, a CD, a flexible disk, a semiconductor memory, and the like), or can be transmitted from another device via, e.g., a dedicated line, and used on-line.

For example, the control unit 60 controls the respective components of the plasma processing apparatus to perform the plasma processing method to be described below. Specifically, the control unit 60 forms a carbon-containing film on surfaces of components in the processing chamber 1 by using a plasma of a carbon-containing gas. Then, the control unit 60 forms a silicon-containing film whose thickness is determined based on a film thickness of the carbon-containing film on the surface of the carbon-containing film by using a silicon-containing gas. After the silicon-containing film is formed, the control unit 60 processes the target object loaded into the processing chamber 1 by using a plasma of a processing gas. Then, the target object processed by the plasma is unloaded from the processing chamber 1, and the control unit 60 removes the silicon-containing film from the surface of the carbon-containing film by using a plasma of a fluorine-containing plasma. Then, the control unit 60 removes the carbon-containing film from the surfaces of the components in the processing chamber 1 by using a plasma of an oxygen-containing gas. Here, the components in the processing chamber 1 include, e.g., the inner wall of the processing chamber 1, and the mounting table 2 serving as a lower electrode, the inner wall member 3a, the supporting table 4 and the deposition shield 77 which are provided in the processing chamber 1. Hereinafter, the components in the processing chamber 1 may be referred to as "in-chamber components". The target object is, e.g., a semiconductor wafer W.

Figure 2:
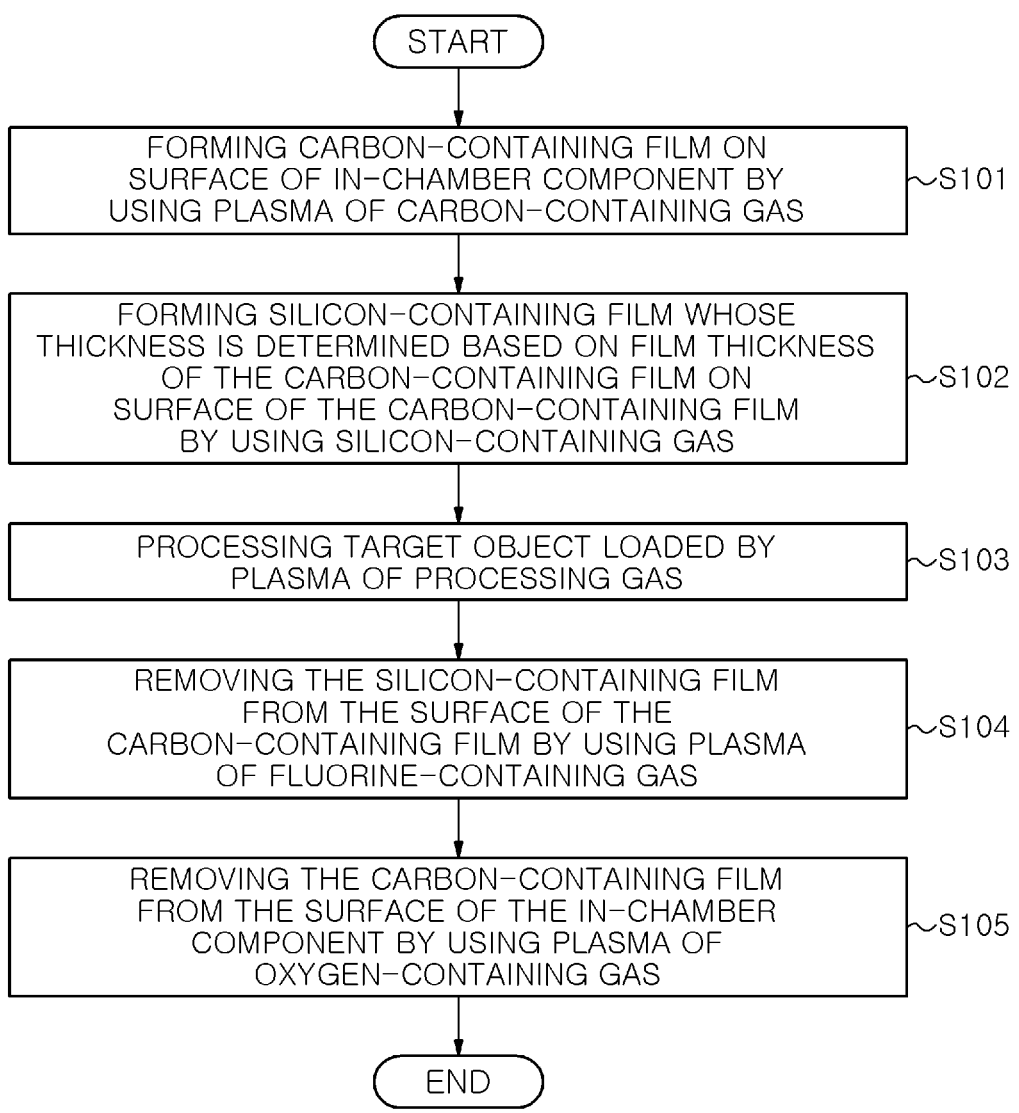
FIG. 2 is a flowchart showing an exemplary sequence of the plasma processing method performed by the plasma processing apparatus according to an embodiment.

Next, the plasma processing method performed by the plasma processing apparatus of the present embodiment will be described. FIG. 2 is a flowchart showing an exemplary sequence of the plasma processing method performed by the plasma processing apparatus of the present embodiment.

As shown in FIG. 2, the plasma processing apparatus performs a first film forming step of forming a carbon-containing film on surfaces of in-chamber components by using a plasma of a carbon-containing gas (step S101). The carbon-containing gas includes a gas expressed by, e.g., $C_xH_yF_z$ (x, y and z being integers and (z−y)/x being smaller than or equal to 2). The carbon-containing gas may include at least one of, e.g., $CH_4$, $C_4F_8$, $CHF_3$, $CH_3F$ and $C_2H_4$. When the carbon-containing gas includes an F-containing gas (e.g., at least one of $C_4F_8$, $CHF_3$ and $CH_3F$), the carbon-containing gas may further include $H_2$. Preferably, the carbon-containing gas further includes a rare gas. The rare gas is, e.g., Ar or He.

Hereinafter, a specific example thereof will be described. The control unit 60 of the plasma processing apparatus supplies a carbon-containing gas from the processing gas supply source 15 into the processing chamber 1 in a state where a substrate (hereinafter, referred to as "dummy wafer") different from the target object is mounted on the mounting table 2 and applies the high frequency power for plasma generation from the first high frequency power supply 10a, thereby generating a plasma of the carbon-containing gas. At this time, the control unit 60 does not apply the high frequency power for ion attraction from the second high frequency power supply 10b. As a result, a carbon-containing film is formed on the surfaces of the in-chamber components by the plasma of the carbon-containing gas.

Next, the plasma processing apparatus performs a second film forming step of forming a silicon-containing film whose thickness is determined based on a film thickness of the carbon-containing film on the surface of the carbon-containing film by using a silicon-containing gas (step S102). The film thickness of the silicon-containing film determined in the second film forming step is determined based on the film thickness of the carbon-containing film while balancing a film stress of the silicon-containing film and that of the carbon-containing film. For example, when the film thickness of the carbon-containing film is greater than 100 nm, the film thickness of the silicon-containing film formed in the second film forming step is greater than or equal to 50% of the film thickness of the carbon-containing film. When the film thickness of the carbon-containing film is smaller than or equal to 100 nm, the film thickness of the silicon-containing film is greater than or equal to 20% of the film thickness of the carbon-containing film. The silicon-containing gas includes at least one of, e.g., $SiF_4$ and $SiCl_4$. An oxygen-containing gas may be added to the silicon-containing gas. When the oxygen-containing gas is added, a flow rate ratio of the oxygen-containing gas to the silicon-containing gas is preferably 2 to 10. Preferably the silicon-containing gas further includes a rare gas. The rare gas is, e.g., Ar or He.

Hereinafter, a specific example thereof will be described. The control unit 60 of the plasma processing apparatus supplies a silicon-containing gas from the processing gas supply source 15 into the processing chamber 1 in a state where a dummy wafer is mounted on the mounting table 2, and supplies an oxygen-containing gas into the processing chamber 1 from the processing gas supply source 15, and applies the high frequency power for plasma generation from the first high frequency power supply 10a, thereby generating a plasma of the silicon-containing gas and the oxygen-containing gas. At this time, the control unit 60 does not apply the high frequency power for ion attraction from the second high frequency power supply 10b. As a result, a silicon-containing film is formed on the surface of the carbon-containing film by the plasma of the silicon-containing gas and the oxygen-containing gas. In other words, a protective film including the carbon-containing film and the silicon-containing film is formed on the surfaces of the in-chamber components.

FIG. 3 shows exemplary relation between a film thickness of the carbon-containing film, a film thickness of the silicon-containing film and the number of particles generated from the protective film including the carbon-containing film and the silicon-containing film. In FIG. 3, "W/O Carbon Coating" indicates that the carbon-containing film does not exist. In other words, a film thickness of the carbon-containing film is 0 nm. "W/O Ox Coating" indicates that the silicon-containing film does not exist. In other words, a film thickness of the silicon-containing film is 0 nm. "1st layer; Carbon Coating" indicates a film thickness of the carbon-containing film, e.g., 50 nm, 100 nm or 200 nm. "2nd layer; Ox Coating" indicates a film thickness of the silicon-containing film, e.g., 20 nm, 50 nm, 100 nm or 200 nm.

Numerical values within a frame R1 corresponding to "1st layer; Carbon Coating" and "2nd layer; Ox Coating" indicate the number of particles generated from the protective film including the carbon-containing film and the silicon-containing film in the case of applying the plasma of the processing gas. Numerical values within a frame R2 corresponding to "1st layer; Carbon Coating" and "W/O Ox Coating" indicate the number of particles generated from the carbon-containing film in the case of applying the plasma of the processing gas. Numerical values within a frame R3 corresponding to "2nd layer; Ox Coating" and "W/O Carbon Coating" indicate the number of particles generated from the silicon-containing film in the case of applying the plasma of the processing gas. Numerical values within a frame R4 corresponding to "W/O Carbon Coating" and "W/O Ox Coating" indicate the number of particles generated from the surfaces of the in-chamber components in the case of applying the plasma of the processing gas. In FIG. 3, the number of particles within the frames R1 to R3 is expressed as an average of the number of particles measured in the case of repeating the film formation and the application of the plasma of the processing gas three times. In FIG. 3, the number of particles within in the frame R4 is expressed as an average of the number of particles measured in the case of repeating the application of the plasma of the processing gas three times. In FIG. 3, $CF_4$ was used as the processing gas.

As shown in the frame R1 of FIG. 3, when the carbon-containing film has a film thickness of 200 nm and silicon-containing film has a film thickness of 50 nm, i.e., when the film thickness of the silicon-containing film is 25% of the film thickness of the carbon-containing film, the number of particles was 34.7 which does not satisfy a predetermined allowable specification (e.g., 10).

As shown in the frame R1 of FIG. 3, when the carbon-containing film has a film thickness of 200 nm and the silicon-containing film has a film thickness of 100 nm, i.e., when the film thickness of the silicon-containing film is 50% of the film thickness of the carbon-containing film, the number of particles was 8.7 which satisfies the predetermined allowable specification (e.g., 10). As shown in the frame R1 of FIG. 3, when the carbon-containing film has a film thickness of 100 nm and the silicon-containing film has a film thickness of 20 nm, 50 nm, 100 nm or 200 nm, i.e., when the film thickness of the silicon-containing film is greater than or equal to 20% of the film thickness of the carbon-containing film, the number of particles was 2.0, 5.0, 3.3 or 1.0 which satisfies the predetermined allowable specification (e.g., 10).

As can be seen from the result shown in FIG. 3, when the film thickness of the carbon-containing film is greater than 100 nm, the number of particles generated from the protective film including the carbon-containing film and the silicon-containing film can be reduced by setting the film thickness of the silicon-containing film to be greater than or equal to 50% of the film thickness of the carbon-containing film. When the film thickness of the carbon-containing film is smaller than or equal to 100 nm, the number of particles generated from the protective film including the carbon-containing film and the silicon-containing film can be reduced by setting the film thickness of the silicon-containing film to be greater than or equal to 20% of the film thickness of the carbon-containing film. This is because when the film thickness of the silicon-containing is appropriate for the film thickness of the carbon-containing film, the balance between the film stress of the silicon-containing film and that of the carbon-containing film is maintained and the bonding between the silicon-containing film and the carbon-containing film is enhanced.

Figure 4:
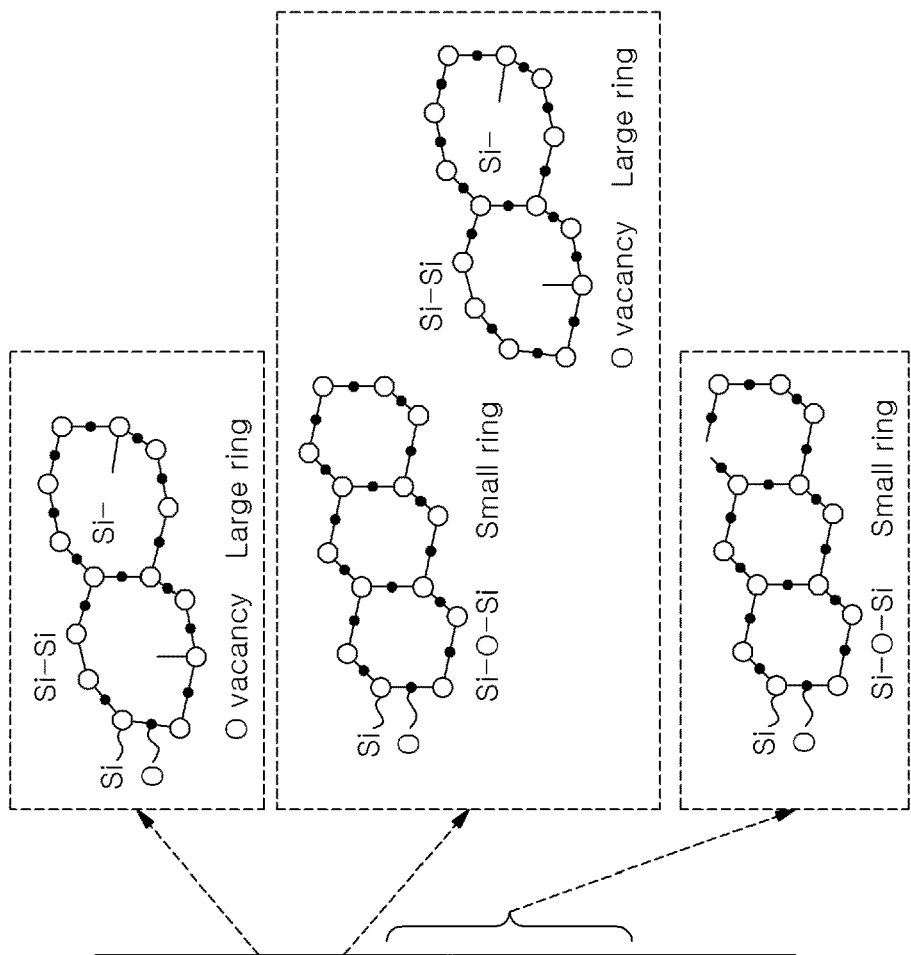
FIG. 4 shows exemplary relation between a flow rate ratio of an oxygen-containing gas to a silicon-containing gas in the case where the oxygen-containing gas is added in a second film forming step, a composition ratio of the silicon-containing film and a film density.

FIG. 4 shows exemplary relation between the flow rate of the oxygen-containing gas to the silicon-containing gas in the case where the oxygen-containing gas is added in the second film forming step, a composition ratio of the silicon-containing film and a film density. In FIG. 4, "flow rate ratio" indicates a flow rate ratio of the oxygen-containing gas to the silicon-containing gas in the case of adding the oxygen-containing gas in the second film forming process. "Si/O composition ratio" indicates a ratio of Si and $O_2$ contained in the silicon-containing film. "Film density" indicates a film density of the silicon-containing film. In FIG. 4, the silicon-containing gas is $SiCl_4$, and the oxygen-containing gas is $O_2$. In FIG. 4, "Si/O composition ratio" and "film density" of the silicon-containing film formed by a CVD method ("CVD $SiO_2$ ($SiH_4/O_2$)") are illustrated as reference data. In FIG. 4, "film density" of the silicon-containing film formed by a thermal oxidation method ("Th—$SiO_2$") is illustrated as reference data.

As can be seen from FIG. 4, when the flow rate ratio of the oxygen-containing gas to the silicon-containing gas is smaller than 2, i.e., $SiCl_4/O_2$=15/5 sccm or 15/15 sccm, the film density was smaller than or equal to 1.63 $g/cm^3$ which does not satisfy the predetermined allowable specification.

When the flow rate ratio of the oxygen-containing gas to the silicon-containing gas is 2 to 10, i.e., $SiCl_4/O_2$=15/30 sccm, 15/60 sccm, 15/60 sccm or 15/150 sccm, the film density was greater than or equal to 1.92 $g/cm^3$ which is substantially the same as the film density of the silicon-containing film formed by the CVD method and satisfies the predetermined allowable specification. This is because O vacancy between Si particles in the silicon-containing film is reduced compared to the case where the flow rate ratio of the oxygen-containing gas to the silicon-containing gas is smaller than 2.

As can be seen from the result shown in FIG. 4, by setting the flow rate ratio of the oxygen-containing gas to the silicon-containing gas to 2 to 10, the silicon-containing film having a high density and a high quality can be formed and, further, the plasma resistance can be improved.

Referring back to FIG. 2, the plasma processing apparatus performs a plasma processing step of processing the target object loaded into the processing chamber 1 by using a plasma of a processing gas (step S103). The target object is, e.g., a semiconductor wafer W on which a silicon oxide film is laminated. The processing gas is at least one of $CF_4$ and $C_4F_6/Ar/O_2$, for example.

Hereinafter, a specific example thereof will be described. The control unit 60 of the plasma processing apparatus allows the target object to be loaded into the processing chamber 1 through the loading/unloading port 74 and the gate valve 75 and mounted on the electrostatic chuck 6. Then, the control unit 60 supplies the processing gas from the processing gas supply source 15 into the processing chamber 1 and applies the high frequency power for plasma generation and the high frequency power for ion attraction from the first and the second high frequency power supply 10a and 10b, respectively. As a result, the target object is processed by the plasma.

Next, the plasma processing apparatus performs a first removal step of removing the silicon-containing film from the surface of the carbon-containing film by using a plasma of a fluorine-containing gas after the target object is unloaded from the processing chamber 1 (step S104). The fluorine-containing gas includes, e.g., $CF_4$.

Hereinafter, a specific example thereof will be described. The control unit 60 of the plasma processing apparatus allows the target object to be unloaded from the processing chamber 1 through the loading/unloading port 74 and the gate valve 75. Then, the control unit 60 supplies a fluorine-containing gas from the processing gas supply source 15 into the processing chamber 1 in a state where a dummy wafer is mounted on the mounting table 2 and applies the high frequency power for plasma generation from the first high frequency power supply 10a. Further, the control unit 60 may apply the high frequency power for ion attraction from the second high frequency power supply 10b. As a result, the silicon-containing film is removed from the surface of the carbon-containing film.

FIGS. 5 and 6 show exemplary relation between the selectivity of the silicon-containing gas and the fluorine-containing gas used for removing the silicon-containing film. FIG. 5 shows the selectivity of the silicon-containing film at each measurement point in the case of using $NF_3/O_2$ (=180/720 sccm) as the fluorine-containing gas. FIG. 6 shows the selectivity of the silicon-containing film at each measurement point in the case of using $CF_4$ (=600 sccm) as the fluorine-containing gas. In FIGS. 5 and 6, "UEL(Center)" indicates a measurement point set at the center of the upper ceiling plate 16b; "UEL(Middle)" indicates a measurement point set between the center of the upper ceiling plate 16b and the edge of the upper ceiling plate 16b; "UEL(Edge)" indicates a measurement point set at the edge of the upper ceiling plate 16b; "Sel. Ox/Carbon" indicates the selectivity of the silicon-containing film to the carbon-containing film; and "Sel. Ox/Poly" indicates the selectivity of the silicon-containing film to Poly-Si.

As shown in FIGS. 5 and 6, in the case of using $CF_4$ as the fluorine-containing gas, the selectivity of the silicon-containing film to the carbon-containing film was higher than that in the case of using $NF_3/O_2$ as the fluorine-containing gas. In other words, in the case of using $CF_4$ as the fluorine-containing gas, the removal of the carbon-containing film positioned below the silicon-containing film was suppressed compared to the case of using $NF_3/O_2$ as the fluorine-containing gas. As can be seen from the results shown in FIGS. 5 and 6, the silicon-containing film can be effectively removed from the surface of the carbon-containing film by using $CF_4$ as the fluorine-containing gas.

The control unit 60 completes the removal of the silicon-containing film in the first removal step in response to the timing at which the emission intensity of the reaction product generated from the silicon-containing film is changed. In other words, the control unit 60 detects the emission intensity of the reaction product by using an end point detector for detecting an intensity of light having inherent wavelength which is emitted from the reaction product in the plasma and stops the supply of the fluorine-containing gas and the application of the high frequency power at the timing at which the variation of the emission intensity exceeds a predetermined level.

Figure 7:
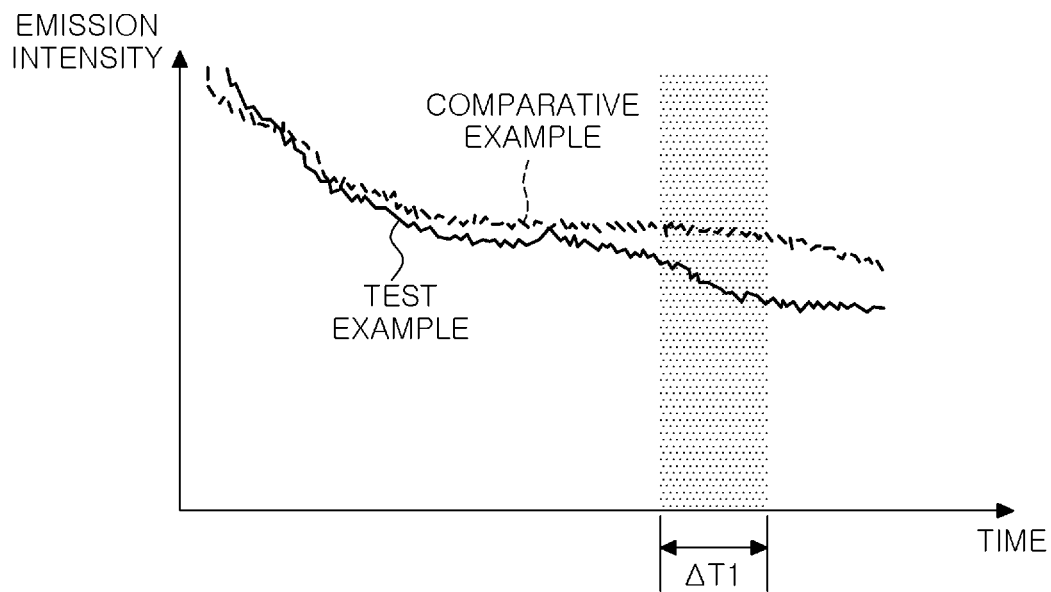
FIG. 7 shows exemplary temporal changes in emission intensities of reaction products generated from silicon-containing films in a comparative example and in a test example.

The following is description of test results obtained in the case of removing a silicon-containing film in a test example in which a silicon-containing film is formed on a surface of a carbon-containing film and in a comparative example in which only a silicon-containing film is directly formed on surfaces of in-chamber components. FIG. 7 shows exemplary temporal changes in the emission intensities of the reaction products generated from the silicon-containing films in the comparative example and in the test example. In FIG. 7, there are illustrated temporal changes in the emission intensities of CO released as the reaction products in the case of removing an $SiO_2$ film as the silicon-containing film by the plasma of the fluorine-containing gas under the following processing conditions in the configuration of the comparative example and in the configuration of the test example.

(Processing Conditions)
Processing pressure: 6.67 Pa (50 mTorr)
High frequency power from the first high frequency power supply: 500 W
High frequency power from the second high frequency power supply: 300 W
Fluorine-containing gas: $CF_4$=600 sccm In the comparative example, as shown in FIG. 7, the emission intensity of CO was monotonically decreased from the start point of the removal of the $SiO_2$ film and an abrupt change in the emission intensity of CO was not detected. In other words, in the comparative example, the timing at which the variation of the emission intensity of CO became smaller than the predetermined level was not detected as the end point by the end point detector. This is because the decrease in the emission intensity of CO was suppressed due to the release of CO as a reaction product from an $SiO_2$ material contained in the in-chamber components after the complete removal of the $SiO_2$ film from the surfaces of the in-chamber components.

On the other hand, in the test example, as shown in FIG. 7, the emission intensity of CO was abruptly decreased and an abrupt change in the emission intensity of CO was detected during a predetermined time range $\Delta T1$ after a predetermined period of time elapses from the start point of the removal of the $SiO_2$ film. In other words, in the test example, the timing at which the variation of the emission intensity of CO exceeded the predetermined level was detected as the end point by the end point detector. This is because the surfaces of the in-chamber components were protected by the carbon-containing film exposed after the complete removal of the $SiO_2$ film from the surface of the carbon-containing film and, thus, the amount of CO released as the reaction product from the in-chamber components was decreased and the emission intensity of CO was abruptly decreased.

Referring back to FIG. 2, the plasma processing apparatus performs a second removal step of removing the carbon-containing film from the surfaces of the in-chamber components by using a plasma of an oxygen-containing gas (step S105). The oxygen-containing gas includes at least $O_2$.

Hereinafter, a specific example thereof will be described. The control unit 60 of the plasma processing apparatus supplies the oxygen-containing gas from the processing gas supply source into the processing chamber 1 in a state where a dummy wafer is mounted on the mounting table 2 after the first removal step of removing the silicon-containing film and applies the high frequency power for plasma generation from the first high frequency power supply 10a. Further, the control unit 60 may apply the high frequency power for ion attraction from the second high frequency power supply 10b. As a result, the carbon-containing film is removed from the surfaces of the in-chamber components.

Further, the control unit 60 completes the removal of the carbon-containing film in the second removal step in response to the timing at which the emission intensity of the reaction product generated from the carbon-containing film is changed. In other words, the control unit 60 detects the emission intensity of the reaction product by using the end point detector for detecting an intensity of light having inherent wavelength which is emitted from the reaction product in the plasma and stops the supply of the oxygen-containing gas and the application of the high frequency power at the timing at which the variation of the emission intensity becomes smaller than the predetermined level.

Figure 8:
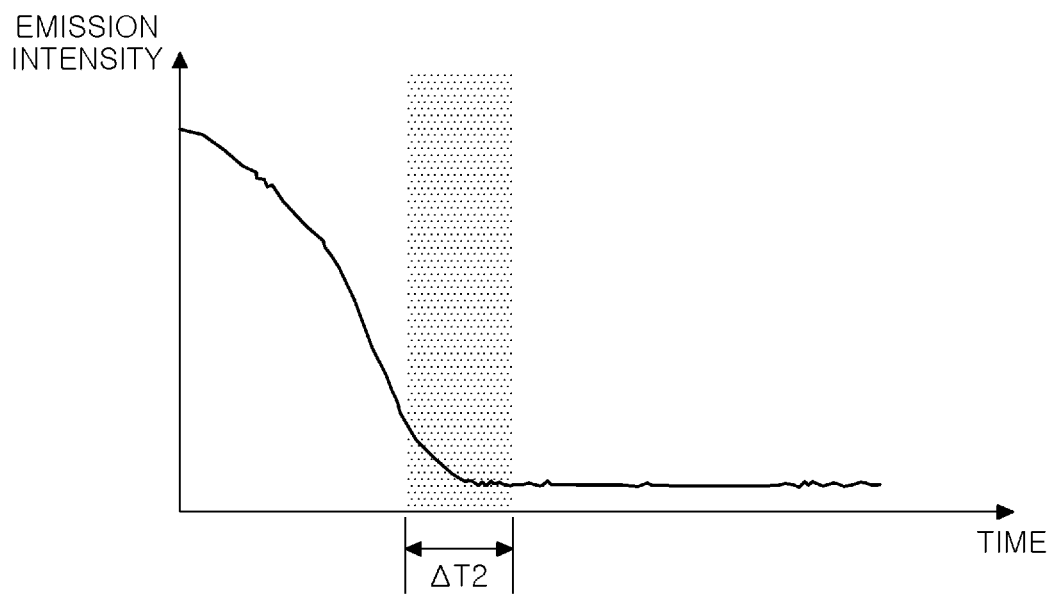
FIG. 8 shows exemplary temporal changes in emission intensity of a reaction product generated from the carbon containing film.

FIG. 8 shows exemplary temporal changes in the emission intensity of the reaction product generated from the carbon containing film. In FIG. 8, there are illustrated temporal changes in the emission intensity of CO released as the reaction product in the case of removing the carbon-containing film by the plasma of the oxygen-containing gas under the following processing conditions.

(Processing Conditions)
Processing pressure: 2.67 Pa (20 mTorr)
High frequency power from the first high frequency power supply: 600 W
High frequency power from the second high frequency power supply: 200 W
Oxygen-containing gas: $O_2$=500 sccm As shown in FIG. 8, in the case of removing the carbon-containing film by the plasma of the oxygen-containing gas, the emission intensity of CO was saturated at a predetermined level and the change in the emission intensity of CO was not detected during a predetermined time range $\Delta T2$ after a predetermined period of time elapses from the start point of the removal of the carbon-containing film. In other words, in the case of removing the carbon-containing film by the plasma of the oxygen-containing gas, the timing at which the variation of the emission intensity became smaller than the predetermined level was detected as the end point by the end point detector. This indicates that the in-chamber components were not eroded by the plasma of the oxygen-containing gas after the complete removal of the carbon-containing film from the surfaces of the in-chamber components.

Figure 9:
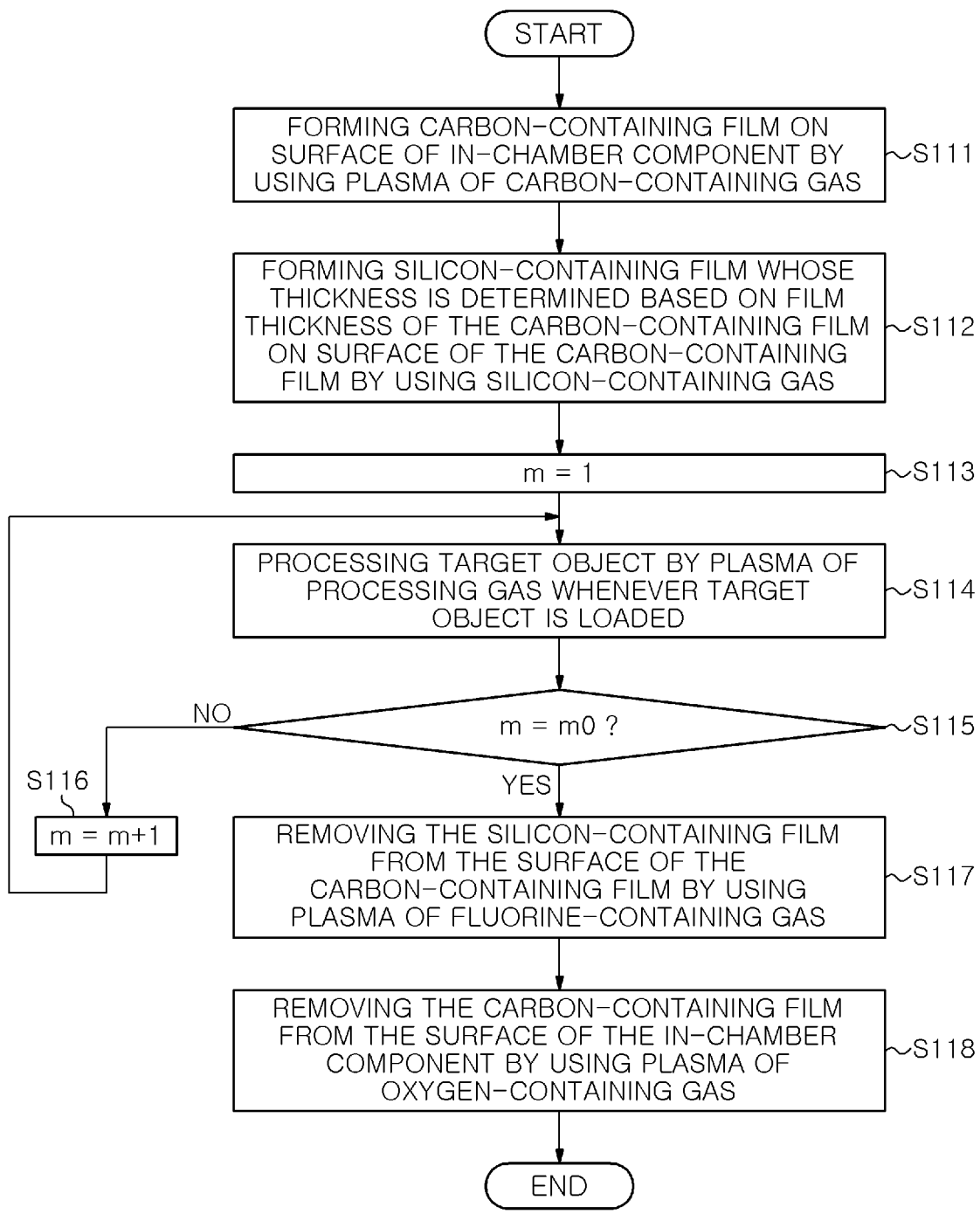
FIG. 9 is a flowchart showing another exemplary sequence of the plasma processing method performed by the plasma processing apparatus according to the embodiment.

Next, another exemplary sequence of the plasma processing method performed by the plasma processing apparatus of the present embodiment will be described with reference to FIG. 9. FIG. 9 is a flowchart showing another exemplary sequence of the plasma processing method performed by the plasma processing apparatus of the present embodiment. In a plasma processing step of the plasma processing method shown in FIG. 9, a plurality of target objects is sequentially loaded into the processing chamber 1 and processed by the plasma of the processing gas after the formation of the silicon-containing film. In a first removal step of the plasma processing method shown in FIG. 9, the silicon-containing film is removed from the surface of the carbon-containing film by the plasma of the fluorine-containing gas after the last target object processed by the plasma, among the plurality of target objects, is unloaded from the processing chamber 1.

As shown in FIG. 9, the plasma processing apparatus performs a first film forming step of forming a carbon-containing film on surfaces of the in-chamber components by using a plasma of a carbon-containing gas (step S111). Since the step S111 is the same as the step S101, the description thereof will be omitted.

Next, the plasma processing apparatus performs a second film forming step of forming a silicon-containing film whose film thickness is determined based on a film thickness of the carbon-containing film on the surface of the carbon-containing film by a silicon-containing gas (step S112). Since the step S112 is the same as the step S102, the description thereof will be omitted.

Next, the plasma processing apparatus sets an initial value "1" to a variable m used for counting the number of repetition of the processes (step S113). The variable m indicates the number of target objects sequentially loaded into the processing chamber 1.

Next, the plasma processing apparatus performs the plasma processing step of processing each target object by using a plasma of a processing gas whenever each target object is loaded (step S114).

Hereinafter, a specific example thereof will be described. The control unit 60 of the plasma processing apparatus allows a target object to be loaded into the processing chamber 1 through the loading/unloading port 74 and the gate valve 75. Then, the control unit 60 supplies the processing gas from the processing gas supply source 15 into the processing chamber 1 and applies the high frequency power for plasma generation and the high frequency power for ion attraction from the first and the second high frequency power supply 10a and 10b, respectively. As a result, the target object is processed by the plasma.

Next, the plasma processing apparatus determines whether or not the last target object processed by the plasma among the plurality of target objects is unloaded from the processing chamber 1, i.e., whether or not the variable m has reached a predetermined number m0 indicating the predetermined number of target objects (step S115). When the variable m has not reached the predetermined number m0 (NO in step S115), the plasma processing apparatus increases the variable m by one (step S116) and returns the processing to the step S114. When the variable m has reached the predetermined number m0 (YES in step S115), the processing proceeds the first removal step.

Next, the plasma processing apparatus performs the first removal step of removing the silicon-containing film from the surface of the carbon-containing film by using a plasma of a fluorine-containing gas after the last target object processed by the plasma among the plurality of target objects is unloaded from the processing chamber 1 (step S117).

Hereinafter, a specific example thereof will be described. The control unit 60 of the plasma processing apparatus allows the last target object processed by the plasma to be unloaded from the processing chamber 1 through the loading/unloading port 74 and the gate valve 75. Then, the control unit 60 supplies a fluorine-containing gas from the processing gas supply source 15 into the processing chamber 1 in a state where a dummy wafer is mounted on the mounting table 2 and applies the high frequency power for plasma generation from the first high frequency power supply 10a. Further, the control unit 60 may apply the high frequency power for ion attraction from the second high frequency power supply 10b. As a result, the silicon-containing film is removed from the surface of the carbon-containing film.

Next, the plasma processing apparatus performs a second removal step of removing the carbon-containing film from the surfaces of the in-chamber components by using a plasma of an oxygen-containing gas (step S118). Since the step S118 is the same as the step S105, the description thereof will be omitted.

As described above, in the present embodiment, before the target object is processed by the plasma, the carbon-containing film is formed on the surfaces of the in-chamber components by the plasma of the carbon-containing gas, and the silicon-containing film whose film thickness is determined based on the film thickness of the carbon-containing film is formed on the surface of the carbon-containing film by the silicon-containing gas. Therefore, in the present embodiment, in the protective film including the carbon-containing film and the silicon-containing film formed on the surfaces of the in-chamber components, the balance between the film stress of the silicon-containing film and that of the carbon-containing film can be maintained and the bonding between the silicon-containing film and the carbon-containing film can be enhanced. As a result, the generation of particles from the protective film for protecting the surfaces of the in-chamber components can be suppressed.

(Another Embodiment)

While the plasma processing method and the plasma processing apparatus of the present embodiments have been described, the embodiments are not limited thereto. Hereinafter, another embodiment will be described.

In the above embodiment, in the second film forming step, the silicon-containing film whose film thickness is determined based on the film thickness of the carbon-containing film is formed on the surface of the carbon-containing film by the plasma of the oxygen-containing gas and the silicon-containing gas. However, the disclosed technique is not limited thereto. For example, in the second film forming step, the silicon-containing film whose film thickness is determined based on the film thickness of the carbon-containing film may be formed on the surface of the carbon-containing film by the plasma of the reducing gas and the silicon-containing gas. The reducing gas may include at least one of $H_2$, $CH_4$ and $C_3H_6$, for example.

For example, in the second film forming step, the silicon-containing film whose film thickness is determined based on the film thickness of the carbon-containing film may be formed on the surface of the carbon-containing film by alternately repeating a step of supplying a plasma of a silicon-containing gas and a step of supplying a plasma of an oxygen-containing gas. In that case, at least one of $SiF_4$ and $SiCl_4$ is used as the silicon-containing gas, for example.

For example, in the second film forming step, the silicon-containing film whose film thickness is determined based on the film thickness of the carbon-containing film may be formed on the surface of the carbon-containing film by alternately repeating a step of supplying a silicon-containing gas and a step of supplying a plasma of an oxygen-containing gas. In that case, an aminosilane-based gas is used as the silicon-containing gas, for example.

For example, in the second film forming step, the silicon-containing film whose film thickness is determined based on the film thickness of the carbon-containing film may be formed on the surface of the carbon-containing film by the plasma of the nitrogen-containing gas and the silicon-containing gas. In that case, the silicon-containing film formed on the surface of the carbon-containing film is a silicon nitride film.

While the disclosure has been shown and described with respect to the embodiments, it will be understood by those skilled in the art that various changes and modifications may be made without departing from the scope of the disclosure as defined in the following claims.

What is claimed is:

1. A plasma processing method comprising:
   a first film forming step of forming a carbon-containing film on surfaces of components in a chamber by using a plasma of a carbon-containing gas;
   a second film forming step of forming a silicon-containing film whose film thickness is determined based on a film thickness of the carbon-containing film on a surface of the carbon-containing film by a silicon-containing gas;
   a plasma processing step of processing a target object loaded into the chamber by using a plasma of a processing gas after the formation of the silicon-containing film;
   a first removal step of removing the silicon-containing film from the surface of the carbon-containing film by using a plasma of a fluorine-containing gas after the target object processed by the plasma is unloaded from the chamber; and a second removal step of removing the carbon-containing film from the surfaces of the components by using a plasma of an oxygen-containing gas, wherein the film thickness of the silicon-containing film determined in the second film forming step is greater than or equal to a predetermined fraction of the film thickness of the carbon-containing film to maintain a balance between a film stress of the silicon-containing film and a film stress of the carbon-containing film.

2. The plasma processing method of claim 1, wherein when the film thickness of the carbon-containing film is greater than 100 nm, the film thickness of the silicon-containing film formed in the second film forming step is greater than or equal to 50% of the film thickness of the carbon-containing film, and when the film thickness of the carbon-containing film is smaller than or equal to 100 nm, the film thickness of the silicon-containing film formed in the second film forming step is greater than or equal to 20% of the film thickness of the carbon-containing film.

3. The plasma processing method of claim 1, wherein in the second film forming step, an oxygen-containing gas is added at a flow rate such that a flow rate ratio of the oxygen-containing gas to the silicon-containing gas becomes 2 to 10 and the silicon-containing film is formed on the surface of the carbon-containing film by using a plasma of the silicon-containing gas and the added oxygen-containing gas.

4. The plasma processing method of claim 1, wherein in the first removal step, the removal of the silicon-containing film is completed when an emission intensity of a reaction product generated from the silicon-containing film is changed.

5. The plasma processing method of claim 1, wherein in the plasma processing step, a plurality of target objects is sequentially loaded into the chamber and processed by the plasma of the processing gas after the formation of the silicon-containing film, and in the first removing step, the silicon-containing film is removed from the surface of the carbon-containing film by the plasma of the fluorine-containing gas after the last target object processed by the plasma, among the plurality of target objects, is unloaded from the chamber.

6. The plasma processing method of claim 1, wherein the carbon-containing gas includes a gas expressed by $C_xH_yF_z$, where x, y and z are integers and $(z-y)/x$ is smaller than or equal to 2.

7. The plasma processing method of claim 6, wherein the carbon-containing gas includes at least one of $CH_4$, $C_4F_8$, $CHF_3$, $CH_3F$ and $C_2H_4$.

8. The plasma processing method of claim 1, wherein the silicon-containing gas includes at least one of $SiCl_4$ and $SiF_4$.

9. The plasma processing method of claim 1, wherein in the second film forming step, the silicon-containing film is formed on the surface of the carbon-containing film by using a plasma of the silicon-containing gas.

10. The plasma processing method of claim 1, wherein the fluorine-containing gas includes $CF_4$.

* * * * *